United States Patent [19]
Bullock et al.

[11] Patent Number: 5,107,204
[45] Date of Patent: Apr. 21, 1992

[54] LOW TEMPERATURE COEFFICIENT SHUNT FOR CURRENT MEASUREMENT

[75] Inventors: Donald F. Bullock, Somersworth; Warren R. Germer, Dover, both of N.H.; Maurice J. Ouellette, North Berwick, Me.

[73] Assignee: General Electric Company, Somersworth, N.H.

[21] Appl. No.: 944,021

[22] Filed: Dec. 22, 1986

[51] Int. Cl.⁵ .............................................. G01R 1/20
[52] U.S. Cl. ..................................... 324/127; 324/105
[58] Field of Search ........................ 324/127, 126, 105

[56] References Cited

U.S. PATENT DOCUMENTS

| | | | |
|---|---|---|---|
| 606,171 | 6/1898 | Shallenberger | 324/105 |
| 1,618,058 | 2/1927 | Church | 324/105 |
| 4,492,919 | 1/1985 | Milkovic | 324/127 |
| 4,616,176 | 10/1986 | Mercure et al. | 324/127 |

OTHER PUBLICATIONS

U.S. Patent Application 07/399,344, filed Aug. 28, 1989, entitled Coaxial Current Sensors.

Information Disclosure Statement submitted in the patent application identified as document AR herein.

*Primary Examiner*—Ernest F. Karlsen
*Attorney, Agent, or Firm*—Robert E. Brunson; Thomas R. Morrison

[57] ABSTRACT

A current sensor employs a main resistor of a low temperature-coefficient material for producing a voltage drop proportional to a load current therein. A second resistor, also of a low temperature-coefficient material, and preferably having a resistance substantially exceeding that of the main resistor, is connected in parallel with the main resistor. The current divides between the main and the second resistors according to the ratio of their resistances. An output signal, reduced at least in accordance with a ratio of resistances of the first and second resistors, is obtained from the second resistor. Resistive heating of the main resistor is reduced by using a short path length in the direction of current flow and as large an area transverse to the direction of current as possible. A current transformer may employ the second resistor as a primary to step down further the current in the output signal.

21 Claims, 2 Drawing Sheets

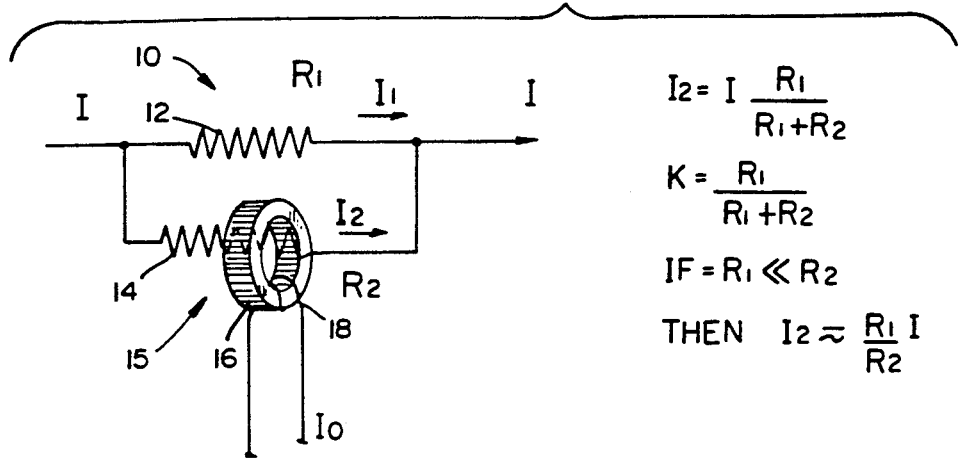
FIG. 1
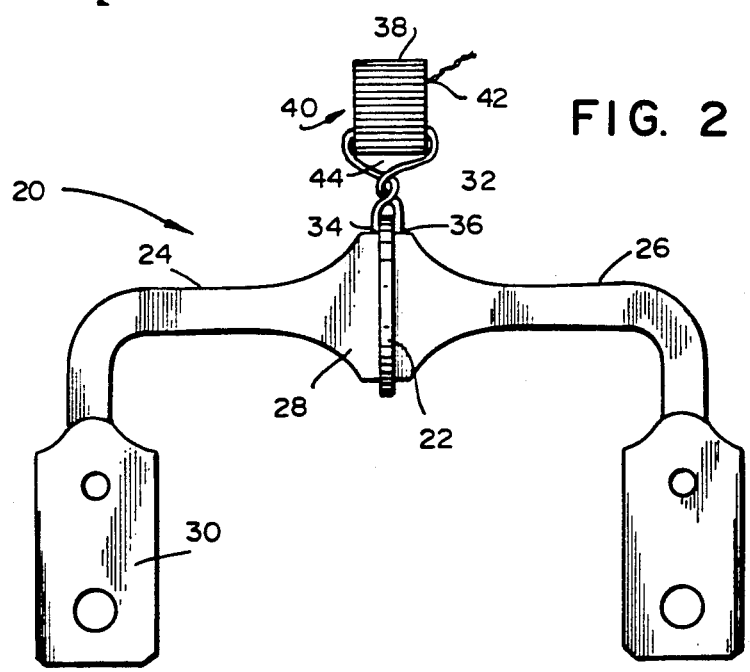
FIG. 2
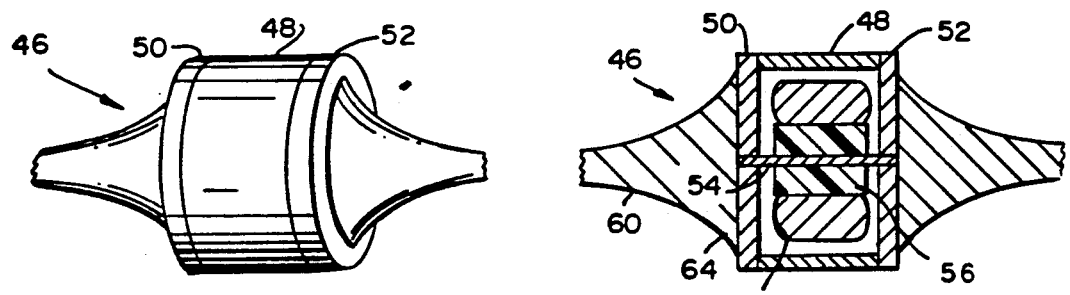
FIG. 3
FIG. 4

LOW TEMPERATURE COEFFICIENT SHUNT FOR CURRENT MEASUREMENT

BACKGROUND OF THE INVENTION

The present invention relates to electrical measurement devices and, more particularly, to devices for measuring current.

Electric watthour meters, for example, employ load current applied to a current stator as part of the driving apparatus for rotating a metallic disk against the retarding force of a permanent magnet. Such devices are capable of direct measurement of energy consumption in the presence of currents as high as a few hundred amperes. For higher values of current, a current transformer may be provided to reduce the load current by a predetermined ratio. Such current transformers have a small number of primary turns and a large number of secondary turns. The output current in the secondary is approximately equal to the primary current divided by the turns ratio.

Problems occur when it is desired to produce a signal in the range of a few milliamperes in response to load currents in the range of several amperes to several hundred amperes. If, for example, a desired full-range output signal of 10 milliamperes is desired in response to a load current of 200 amperes, a ratio of about 20,000 is required. To attain such a ratio in a current transformer with a one-turn primary requires 20,000 turns on the secondary. It is difficult and expensive to wind this many turns on even a large transformer core, and the resistance of the resulting winding would be so high that poor performance of the transformer would result. When it is desired to perform such current scaling within reasonable size and cost constraints, techniques other than current transformers must be considered.

One prior art technique disclosed, for example, in U.S. Pat. No. 4,182,982 employs a current-carrying conductive plate with a window cut into it, thus dividing the plate into a resistive current divider in which a shunt resistance carries most of the current and a parallel measurement branch carries a fraction of the total current. A core having many turns is disposed on the measurement branch to produce an output current equal to the product of the resistive reduction and the turns ratio. This device is conventionally formed using a metal of high conductivity such as, for example, copper. Unfortunately, copper, as well as most other practical metals, has a high temperature coefficient of resistance. A slight temperature difference between the main current path and the measurement path is capable of producing an error sufficiently large to destroy the value of the current measurement for critical applications. In addition, the disclosed arrangement is prone to disturbance by magnetic fields produced by the current being measured and by external magnetic fields.

One attempt to solve the problem of external magnetic fields and temperature coefficient of resistance in copper is disclosed in U.S. Pat. No. 4,492,919 wherein two windows cut into a conductive plate produce a central conductive measurement bar of relatively large resistance flanked by symmetrically disposed shunting resistors. Although an improvement on the previously described device, this technique remains subject to disturbance by external magnetic fields and to measurement errors from unequal heating of the parallel paths.

U.S. Pat. Nos. 4,513,273 and 4,496,932 attempt to overcome problems with the temperature coefficient of resistance of copper by maintaining close thermal coupling between parallel current-carrying plates. Such devices lack the precision over the extreme current ranges with which the present invention must deal.

Certain metal alloys have been developed specifically for low temperature coefficient of electrical resistance. Materials having temperature coefficients of resistance of from about 5 to about 40 parts per million per degree centigrade are available at the time of filing of the present disclosure. Such materials are sold under trademarks such as, Nikrothal LX, Cuprothal 294, Karma, Advance, and Manganin. All of these alloys share the property that, besides a low temperature coefficient of resistance, they exhibit high resistivity and are expensive.

OBJECTS AND SUMMARY OF THE INVENTION

It is an object of the invention to provide a current sensor capable of producing an output current related to a load current without substantial errors from interfering magnetic fields or variations in temperature of a conductor material.

It is a further object of the invention to provide a current sensor employing a main current path through a material having a low electrical resistance and a low temperature coefficient of resistance and a measurement path having a higher resistance and a low temperature coefficient of resistance.

It is a still further object of the invention to provide a current sensor wherein a main current path is disposed concentric to a current flow and a measurement current path is arranged parallel to the main current path.

Briefly stated, the present invention provides a current sensor employing a main resistor of a low temperature-coefficient material for producing a voltage drop proportional to a load current therein. A second resistor, also of a low temperature-coefficient material, and preferably having a resistance substantially exceeding that of the main resistor is connected in parallel with the main resistor. The current divides between the main and the second resistors according to the ratio of their resistances. An output signal reduced at least in accordance with a ratio of resistances of the first and second resistors is obtained from the second resistor. Resistive heating of the main resistor is reduced by using a short path length in the direction of current flow and as large an area transverse to the direction of current as possible.

According to an embodiment of the invention, there is provided a current sensor for sensing a load current comprising: a first resistor having a first resistance, a second resistor having a second resistance in parallel with the first resistor, the first resistor being of a first low temperature-coefficient material, whereby variations in the first resistance in response to temperature changes are minimized, the second resistor being of a second low temperature-coefficient material, whereby variation in the second resistance in response to temperature changes are minimized, means for interposing the first resistor for carrying a portion of the load current, means for obtaining a signal from the second resistor proportional to a current therein, and means for substantially preventing an induction of a voltage in the second resistor by a magnetic flux produced by the load current.

According to a feature of the invention, there is provided a current sensor for sensing a load current comprising: a first resistor having a first resistance, a second resistor having a second resistance in parallel with the first resistor, the first resistor being of a first low temperature-coefficient material, whereby variations in the first resistance in response to temperature changes are minimized, the second resistor being of a second low temperature-coefficient material, whereby variation in the second resistance in response to temperature changes are minimized, means for interposing the first resistor for carrying a portion of the load current, means for obtaining a signal from the second resistor proportional to a current therein, means for substantially preventing an induction of a voltage in the second resistor by a magnetic flux produced by the load current, the first resistor is a disk, the current flows between opposed plane surfaces of the disk, the second resistor is a wire having first and second ends connected near the opposed plane surfaces, at least one twist in the wire, and the means for obtaining a signal includes a magnetic core having a plurality of secondary turns thereon, the wire passing through the core and forming, with the core and the secondary turns, a current transformer.

According to a further feature of the invention, there is provided a current sensor for sensing a load current comprising: a first resistor having a first resistance, a second resistor having a second resistance in parallel with the first resistor, the first resistor being of a first low temperature-coefficient material, whereby variations in the first resistance in response to temperature changes are minimized, the second resistor being of a second low temperature-coefficient material, whereby variation in the second resistance in response to temperature changes are minimized, means for interposing the first resistor for carrying a portion of the load current, means for obtaining a signal from the second resistor proportional to a current therein, means for substantially preventing an induction of a voltage in the second resistor by a magnetic flux produced by the load current, the first resistor is a disk, the second resistor is an H-shaped folded loop, a plane of the H-shaped folded loop being disposed normal to a direction of the load current, first means for connecting one end of the H-shaped folded loop near an upstream end of the disk, second means for connecting a second end of the H-shaped folded loop near a downstream end of the disk, the H-shaped folded loop including first, second and third crossbars, means for passing current in the first, second and third crossbars in the same direction, the means for obtaining a signal including a magnetic core upon the first, second and third crossbars and a secondary winding on the magnetic core, the first, second and third crossbars forming a primary of a current transformer, with the secondary winding forming a secondary winding of the secondary transformer, the first and third crossbars being disposed at opposed sides of the second crossbar, the first and third crossbars being connected in parallel, and the second crossbar being connected in series with the first and third crossbars According to a further feature of the invention, there is provided a current sensor for sensing a load current comprising: a first resistor having a first resistance, a second resistor having a second resistance in parallel with the first resistor, the first resistor being of a first low temperature-coefficient material, whereby variations in the first resistance in response to temperature changes are minimized, the second resistor being of a second low temperature-coefficient material, whereby variation in the second resistance in response to temperature changes are minimized, means for interposing the first resistor for carrying a portion of the load current, means for obtaining a signal from the second resistor proportional to a current therein, and means for substantially preventing an induction of a voltage in the second resistor by a magnetic flux produced by the load current, the first resistor is a hollow cylinder, first and second metallic disks closing opposed ends of the hollow cylinder, the means for interposing including means for connecting the load current to the first and second disks whereby a substantial portion of the load current passes through the hollow cylinder parallel to an axis thereof, the second resistor being a bar disposed within the hollow cylinder, and the means for obtaining a signal includes a core of a current transformer on the bar and a secondary winding of the current transformer on the core, the bar being a primary winding of the current transformer.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a simplified schematic diagram of a current sensor usable in the present invention.

FIG. 2 is a side view of a current sensor according to an embodiment of the invention.

FIG. 3 is a perspective view of a current sensor according to a further embodiment of the invention.

FIG. 4 is an axial cross section of the current sensor of FIG. 3.

DETAILED DESCRIPTION OF THE PREFERRED EMBODIMENT

Figure 5:
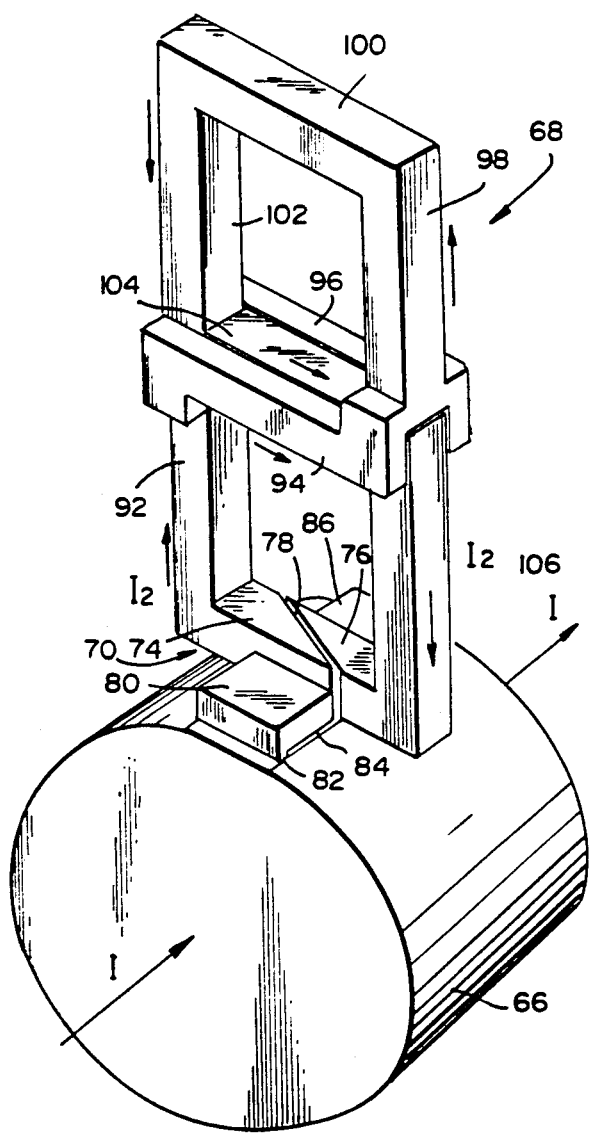
FIG. 5 is a perspective view of a current sensor according to a still further embodiment of the invention.

It will be understood that any of the above alloys, or their equivalents, may be employed in the practice of the invention. For concreteness, an embodiment of the invention is described using Manganin (an alloy of copper and nickel with minor additional components) as an exemplary metal alloy having a low temperature coefficient of resistance.

Referring to FIG. 1, a current divider 10 includes a shunt resistor 12 in parallel with a measurement resistor 14. If a resistance of shunt resistor 12 is very small compared to the resistance of measurement resistor 14, then the current I2 is approximately equal to I*R1/R2.

A current transformer 15 includes a magnetic core 16, employing measurement resistor 14 as a single-turn primary winding, and a secondary winding 18 consisting of a large number of turns of wire. An output current Io from secondary winding 18 is approximately equal the current I2 through measurement resistor 14 divided by the number of turns in secondary winding 18. Thus, secondary winding 18 produces an output current reduced by the product of the current reductions in current divider 10 and in the turns ratio of current transformer 15.

Current divider 10 must be capable of carrying load current without excessive heating or power dissipation. In the referenced prior-art patents, these requirements have led to the use of copper conductors for the two paths of current divider 10. Differences in the cross sections of the two current-carrying paths provide the required differences in resistance. For a large current reduction, the cross section of measurement resistor 14 is made much larger than the cross section of shunt resistor 12.

Unfortunately, due to its large temperature coefficient of resistance, even a temperature difference as small as a fraction of a degree in the copper making up shunt resistor 12 and measurement resistor 14 is sufficient to introduce unacceptable errors in the relationship between load current and measured output. Such a temperature difference is easily produced, for example, by uneven environmental heating or by resistive heating by the passage of current therethrough.

Attempts to replace the copper in the prior-art resistive divider with a low temperature-coefficient material such as Manganin suffers from the high cost of such materials and from their poor conductivity. The poor conductivity (high resistance) of Manganin requires a large material cross section to avoid excessive temperature rise. The high cost makes such large cross sections impractical for cost-sensitive applications.

We have discovered that a Manganin disk of relatively large diameter but small thickness can be installed in series with the load current for producing a small resistance value. The short current path through the thickness of the disk keeps the power dissipation and resistive heating at reasonable values. When a parallel measurement resistor, also of Manganin, is connected in parallel with the disk, the resulting current divider is substantially immune to thermally derived errors.

Referring to FIG. 2, a current sensor 20 includes a disk 22 of a low temperature-coefficient material such as, for example, Manganin. First and second connecting leads 24 and 26, respectively, each include an enlarged portion 28 for providing electrical connection to a face of disk 22 over as large an area as possible. Each of connecting leads 24 and 26 also includes a flattened attachment flange 30 for connection to external apparatus. A wire 32, preferably also of a low temperature-coefficient material such as Manganin, has first and second ends 34 and 36, respectively, electrically connected to opposed faces of disk 22. Wire 32 passes through a core 38 of a current transformer 40 wherein it functions as a one-turn primary winding. A secondary winding 42 on core 38 produces an output voltage proportional to the load current passing through disk 22 for connection to an external device. Wire 32 is preferably twisted between disk 22 and core 38 to cancel the effects of stray magnetic flux.

Wire 32 is opened up from its twisted condition to pass through core 38 thus forming a window 44 which may respond to stray flux to produce a spurious voltage in wire 32 giving rise to a spurious current therein and in secondary winding 42. If the orientation of such stray flux is known, the plane of window 44 may be rotated to avoid interaction. Alternatively, the plane of window 44 may be adjusted for intentional introduction of an induced voltage to counteract other spurious effects.

One skilled in the art will recognize the correspondence between disk 22 and wire 32 in FIG. 2 and shunt resistor 12 and measurement resistor 14, respectively, of FIG. 1. Since the temperature coefficient of resistance of Manganin is very low, the resistive current division provided by the embodiment of FIG. 2 remains substantially constant over the expected range of temperatures and temperature differences of disk 22 and wire 32.

Referring now to FIGS. 3 and 4, a coaxial embodiment of a current sensor 46 is shown. A hollow cylinder 48 of Manganin is sandwiched between end disks 50 and 52. A bar 54 extending between end disks 50 and 52 supports a spacer 56 upon which is disposed a magnetic core 58. Connecting leads 60 and 62, preferably with enlarged portions 64 for interface with surfaces of end disks 50 and 52, conduct load current to and from current sensor 46.

It will be clear to one skilled in the art that the cross-sectional area of hollow cylinder 48 can be made substantially larger than the cross-sectional area of bar 54, whereby a substantial ratio of resistances is attained. An increased resistance ratio may be attainable by using different materials in current sensor 46 and bar 54. For example, Manganin, having a resistivity of about 49 microohm-centimeter may be employed in current sensor 46 while a different low temperature-coefficient material, with a higher resistivity, may be employed in bar 54. For example, a material sold under the trademark Nikrothal LX has a temperature coefficient of resistance about equal to that of Manganin, and resistivity of about 133 microohm-centimeter, or about 2.66 times the resistivity of Manganin. If this material is used in bar 54 with Manganin in hollow cylinder 48, a greater resistance ratio may be attained with a given cross section.

End disks 50 and 52 may be of the same material as hollow cylinder 48 (and bar 54) or they may be made of copper. Using copper may reduce total cost at a possible degradation in resistance to temperature-derived errors. It is in our present contemplation that the mass of each of end disks 50 and 52, together with its enlarged portion 64, may be sufficient, together with the thermal and electrical conductivity of copper, to maintain each of end disks 50 and 52 as essentially isothermal bodies incapable of developing temperature gradients. Thus, errors due to the temperature coefficient of resistance of copper may be small enough to be acceptable.

Figure 6:
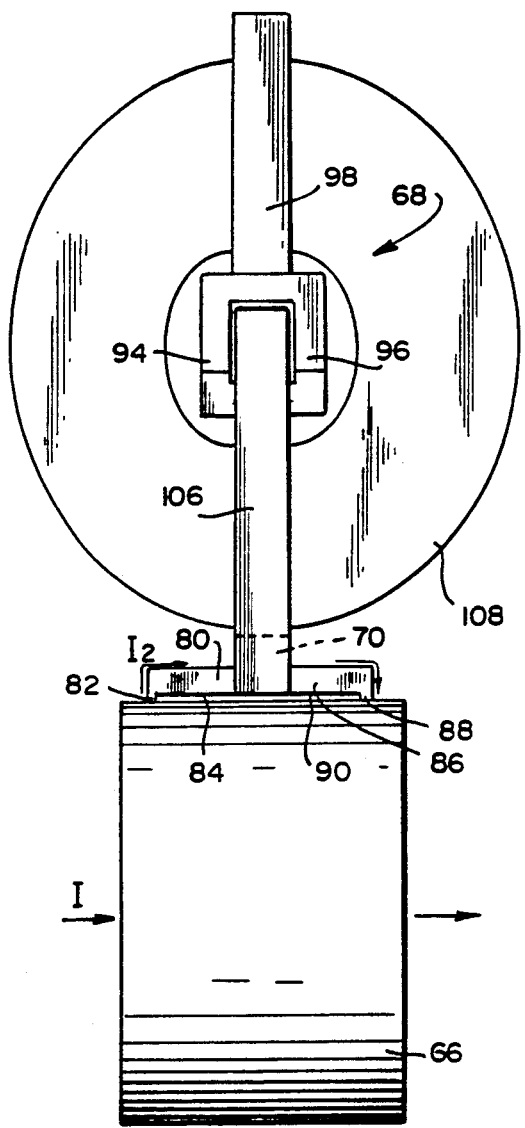
FIG. 6 is a side view of the current sensor of FIG. 5.

Referring now to FIGS. 5 and 6, a solid disk 66 is interposed in series with load current I using, for example, the techniques in the foregoing embodiments. For drawing clarity, electrical connections to and from disk 66 are omitted from these figures and are replaced with arrows indicating the direction of load current. An H-shaped folded loop 68, extending at right angles to the direction of current I, carries current I2, as indicated by labelled directional arrows in the figure.

A lower bar 70 of H-shaped folded loop 68 is divided into separate half bars 74 and 76 by a diagonal slit 78 (visible only in FIG. 5). A half pedestal 80 is affixed at its inner end to half bar 74. An outer end of half pedestal 80 includes a boss 82 affixed near an upstream end of disk 66.

As best seen in FIG. 6, boss 82 creates a gap 84 raising the remainder of half pedestal 80, and half bar 74, out of contact with disk 66. Similarly, a half pedestal 86, affixed at its inner end to half bar 76, includes a boss 88 at its outer end thus creating a gap 90 raising a remainder of half pedestal 86, and the bottom of half bar 76, out of contact with disk 66. A voltage produced in disk 66, forces current to flow in half pedestal 80, through the remainder of H-shaped folded loop 68 and return to disk 66 through half pedestal 86, as indicated by the arrows in the figures. The heights of bosses 82 and 88 are kept as small as possible, within practical manufacturing tolerances, in order to make the area defined by gaps 84 and 90 as small as possible. The small area of gaps 84 and 90 reduces the voltage which may be induced in half pedestals 80 and 86 by flux produced in disk 66 by the load current I flowing therethrough.

The path of bypass current I2 is best seen in the perspective view of FIG. 5. From half bar 74, current I2 flows up a lower side bar 92, then splits to flow in parallel through crossarms 94 and 96. The current rejoins to flow upward in an upper side bar 98, transversely in an upper cross bar 100, and downward in a second upper side bar 102. The current I2 then flows in a center cross bar 104, disposed between parallel crossarms 94 and 96, and thence through a second lower side bar 106 and half pedestal 86 to rejoin disk 66.

It will be noted that the folded figure-H shape of H-shaped folded loop 68 causes the current I2 to flow in the same direction in parallel crossarms 94 and 96 and in center cross bar 104. Although the same result could be achieved using only first and second parallel bars, the resulting loops formed by the modified H-shaped folded loop 68 would be at least partly offset from each other. Offsetting the loops of H-shaped folded loop 68 would increase the possibility of inducing spurious voltages therein due to the presence of a flux produced by the load current I flowing in disk 66 and the conductors leading thereto and therefrom.

Parallel crossarms 94 and 96 and center cross bar 104 form a two-turn primary of a current transformer. A core of secondary coil 108, omitted from FIG. 5 for purposes of description, is disposed on parallel crossarms 94, 96 and center cross bar 104 to produce an output current reduced by the turns ratio of the primary to secondary windings.

Figure 7:
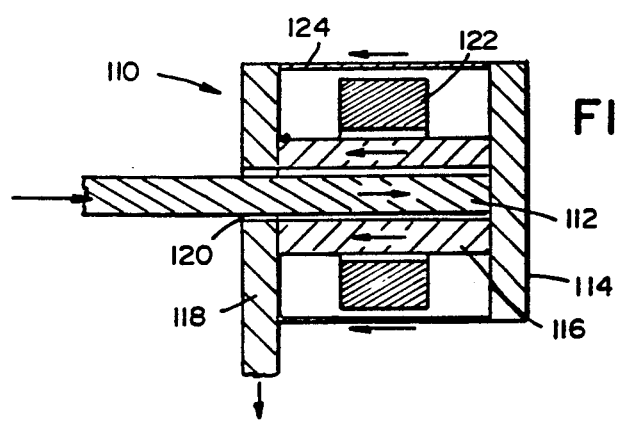
FIG. 7 is a transverse cross section of a still further embodiment of the invention.

Referring now to FIG. 7, a current sensor 110 includes an input conductor 112 affixed to a center of a conductive disk 114. An annular conductor 116, affixed at a first end thereof to conductive disk 114, surrounds an end portion of input conductor 112. An output plate 118, having a hole 120 therein, is affixed to the second end of annular conductor 116 with input conductor 112 passing though hole 120. A core and coil of a current transformer 122 surrounds annular conductor 116 and input conductor 112. An annular outer conductor 124 is connected between conductive disk 114 and output plate 118, surrounding current transformer 122 and the elements encircled thereby.

As is well known, a voltage is induced in the secondary of a toroidal current transformer in proportion to the total current enclosed within the core thereof. In the absence of annular outer conductor 124, the total current enclosed within the core of current transformer 122 is zero. That is, the input current on input conductor 112 is exactly balanced by the return current on annular conductor 116. The presence of a bypass path through annular outer conductor 124 unbalances the current enclosed within current transformer 122 according to the parallel resistances in the manner previously described.

In one embodiment according to FIG. 7, annular outer conductor 124 and annular conductor 116 are of a low temperature-coefficient material such as, for example, Manganin, and input conductor 112, conductive disk 114 and output plate 118 are all of copper. Since the major part of the unbalance in current enclosed in current transformer 122 is due to bypass current through the Manganin in annular outer conductor 124 subtracted from the Manganin in annular conductor 116, acceptably small errors may be induced by the presence of the copper elements.

In a further embodiment of the invention, the materials in input conductor 112 and annular conductor 116 are reversed. That is, input conductor 112 is Manganin and annular conductor 116 is copper. The diameter of input conductor 112 may require increase to account for its larger resistivity, with a suitable change in the thickness of annular conductor 116 to account for the different resistivity. Such changes would be fully within the understanding of one skilled in the art. The function of such a further embodiment is fully equivalent to the that covered in the foregoing description of FIG. 7.

Although each embodiment of the invention illustrated and described in the foregoing employs a multiturn transformer of a current transformer to reduce further the current flowing therefrom, it would be clear to one skilled in the art that the proportional current reduction achieved by the voltage divider consisting of the two low temperature-coefficient materials may be satisfactory for direct use without requiring the additional current reduction provided by the current-transformer function. Such an embodiment should be considered to be part of the present invention.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What we claim is:

1. A current sensor for sensing a load current comprising:

a first resistor having a first resistance;

a second resistor having a second resistance in parallel with said first resistor;

said first resistor being of a first low temperature-coefficient material, whereby variations in said first resistance in response to temperature changes are minimized;

said second resistor being of a second low temperature-coefficient material, whereby variation in said second resistance in response to temperature changes are minimized;

a resistivity of said second low temperature-coefficient material being substantially greater than a resistivity of said first low temperature-coefficient material;

means for interposing said first resistor for carrying a portion of said load current;

means for obtaining a signal from said second resistor proportional to a current therein; and means for substantially preventing an induction of a voltage in said second resistor by a magnetic flux produced by said load current.

2. A current sensor according to claim 1 wherein said first and second low temperature-coefficient materials are the same material.

3. A current sensor according to claim 1 wherein said first and second low temperture-coefficient materials are different.

4. A current sensor according to claim 1 wherein at least one of said first and second low temperature-coefficient materials is Manganin.

5. A current sensor according to claim 1 wherein said first resistor is symmetrically disposed with respect to a current therethrough.

6. A current sensor according to claim 5 wherein said first resistor is a disk, and said current flows between opposed plane surfaces of said disk.

7. A current sensor according to claim 6 wherein said disk includes a diameter exceeding a diameter of conductors carrying said load current thereto, and said conductors include enlarged portions for interfacing with a portion of said opposed plane surfaces exceeding in area a cross sectional area of said conductors.

8. A current sensor according to claim 6 wherein said second resistor is a wire connected near said opposed plane surfaces.

9. A current sensor according to claim 8 wherein said means for substantially preventing includes a twist in said wire.

10. A current sensor according to claim 8 wherein said means for obtaining a signal includes a magnetic core having a plurality of secondary turns thereon, said wire passing through said core and forming, with said core and said secondary turns, a current transformer.

11. A current sensor according to claim 10 wherein an orientation of said wire passing through said core is disposed to control an induced voltage therein.

12. A current sensor according to claim 1 wherein:
said first resistor is a disk;
said second resistor is an H-shaped folded loop;
a plane of said H-shaped folded loop being disposed normal to a direction of said load current;
first means for connecting one end of said H-shaped folded loop near an upstream end of said disk;
second means for connecting a second end of said H-shaped folded loop near a downstream end of said disk;
said H-shaped folded loop including at least first and second crossbars;
means for passing current in said at least first and second crossbars in the same direction; and
said means for obtaining a signal including a magnetic core upon said at least first and second crossbars and a secondary winding on said magnetic core, said at least first and second crossbars forming a primary of a current transformer, with said secondary winding forming a secondary winding of said secondary transformer.

13. A current sensor according to claim 12 wherein said means for substantially preventing includes:
said first crossbar including first and third parallel crossbars disposed at opposed sides of said second crossbar;
said first and third parallel crossbars being connected in parallel; and
said second parallel crossbar being connected in series with said first and third parallel crossbars.

14. A current sensor for sensing a load current comprising:
a first resistor having a first resistance;
a second resistor having a second resistance in parallel with said first resistor;
said first resistor being of a first low temperature-coefficient material, whereby variations in said first resistance in response to temperature changes are minimized;
said second resistor being of a second low temperature-coefficient material, whereby variation in said second resistance in response to temperature changes are minimized;
means for interposing said first resistor for carrying a portion of said load current;
means for obtaining a signal from said second resistor proportional to a current therein;
means for substantially preventing an induction of a voltage in said second resistor by a magnetic flux produced by said load current;
said first resistor is a disk;
said current flows between opposed plane surfaces of said disk;
said second resistor is a wire having first and second ends connected near said opposed plane surfaces;
at least one twist in said wire; and
said means for obtaining a signal includes a magnetic core having a plurality of secondary turns thereon, said wire passing through said core and forming, with said core and said secondary turns, a current transformer.

15. A current sensor for sensing a load current comprising:
a first resistor having a first resistance;
a second resistor having a second resistance in parallel with said first resistor;
said first resistor being of a first low temperature-coefficient material, whereby variations in said first resistance in response to temperature changes are minimized;
said second resistor being of a second low temperature-coefficient material, whereby variation in said second resistance in response to temperature changes are minimized;
means for interposing said first resistor for carrying a portion of said load current;
means for obtaining a signal from said second resistor proportional to a current therein;
means for substantially preventing an induction of a voltage in said second resistor by a magnetic flux produced by said load current;
said first resistor is a disk;
said second resistor is an H-shaped folded loop;
a plane of said H-shaped folded loop being disposed normal to a direction of said load current;
first means for connecting one end of said H-shaped folded loop near an upstream end of said disk;
second means for connecting a second end of said H-shaped folded loop near a downstream end of said disk;
said H-shaped folded loop including first, second and third crossbars;
means for passing current in said first, second and third crossbars in the same direction;
said means for obtaining a signal including a magnetic core upon said first, second and third crossbars and a secondary winding on said magnetic core, said first, second and third crossbars forming a primary of a current transformer, with said secondary winding forming a secondary winding of said secondary transformer;
said first and third crossbars being disposed at opposed sides of said second crossbar;
said first and third crossbars being connected in parallel; and
said second crossbar being connected in series with said first and third crossbars.

16. A current sensor for sensing a load current comprising:
a first resistor having a first resistance;
a second resistor having a second resistance in parallel with said first resistor;

said first resistor being of a first low temperature-coefficient material, whereby variations in said first resistance in response to temperature changes are minimized;

said second resistor being of a second low temperature-coefficient material, whereby variation in said second resistance in response to temperature changes are minimized;

means for interposing said first resistor for carrying a portion of said load current;

means for obtaining a signal from said second resistor proportional to a current therein; and means for substantially preventing an induction of a voltage in said second resistor by a magnetic flux produced by said load current;

said first resistor is a hollow cylinder;

first and second metallic disks closing opposed ends of said hollow cylinder;

said means for interposing including means for connecting said load current to said first and second disks whereby a substantial portion of said load current passes through said hollow cylinder parallel to an axis thereof;

said second resistor being a bar disposed within said hollow cylinder; and said means for obtaining a signal includes a core of a current transformer on said bar and a secondary winding of said current transformer on said core, said bar being a primary winding of said current transformer.

17. A current sensor for sensing a load current comprising:

an input conductor;

an annular conductor surrounding said input conductor;

a core and secondary coil of a current transformer surrounding said annular conductor whereby current in said input conductor and said annular conductor passes through said core, whereby said annular conductor and said input conductor act as a primary of said current transformer;

means for permitting said load current to pass in a first direction in said input conductor and in a second opposite direction in said annular conductor whereby said load current substantially cancels in said current transformer; and an annular outer conductor connected in parallel with one of said input conductor and said annular conductor whereby currents in said first direction in said input conductor and said second direction in said annular conductor become unbalanced.

18. A current sensor according to claim 17 wherein at least said annular outer conductor is of a low temperature-coefficient material.

19. A current sensor according to claim 18 wherein at least one of said annular conductor and said input conductor are of a low temperature-coefficient material.

20. A current sensor according to claim 17 wherein said means for permitting includes:

a conductive disk;

said input conductor being affixed centrally in a surface of said conductive disk;

said annular conductor being affixed at a first end to said conductive disk; and said annular conductor being affixed at a second end to an output plate.

21. A current sensor according to claim 20 wherein said annular outer conductor is connected at a first end to said conductive disk and at a second end to said output plate, thereby being connected in parallel with said annular conductor.

* * * * *